United States Patent

Furnival

[15] 3,643,305

[45] Feb. 22, 1972

[54] METHOD OF FABRICATING A PIEZOELECTRIC DEVICE

[72] Inventor: Thomas J. Furnival, Logansport, Ind.

[73] Assignee: General Motors Corporation, Detroit, Mich.

[22] Filed: June 24, 1970

[21] Appl. No.: 49,288

[52] U.S. Cl. ..............................29/25.35, 29/630 G, 310/9.4

[51] Int. Cl. ....................................B01j 17/00, H04r 17/00

[58] Field of Search................29/25.35, 630 G; 310/9.1, 9.4, 310/9.7

[56] References Cited

UNITED STATES PATENTS

| | | | |
|---|---|---|---|
| 1,975,516 | 10/1934 | Nicolson | 310/9.4 X |
| 3,417,449 | 12/1968 | Sanford | 29/25.35 |
| 3,584,245 | 6/1971 | Helfen | 310/9.4 |

*Primary Examiner*—John F. Campbell
*Assistant Examiner*—Carl E. Hall
*Attorney*—William S. Pettigrew and Robert J. Wallace

[57] ABSTRACT

A method of fabricating a piezoelectric device which includes providing a resilient metallic unit, bonding an insulating base member between two leg members of the unit, severing a bar element of the unit to provide facing projections, and compressively supporting a piezoelectric element therewith prior to permanently bonding it in place.

5 Claims, 5 Drawing Figures

INVENTOR.
Thomas J. Furnival
BY
L. J. Wallace
ATTORNEY

METHOD OF FABRICATING A PIEZOELECTRIC DEVICE

This invention relates to piezoelectric devices and more particularly to a method of fabricating a ceramic resonator device.

Recently, many vehicular devices, such as the passenger car voltage regulator, have been miniaturized by the use of the integrated circuit technology. Contrastingly, the intermediate frequency (IF) transformer appears by comparison large and physically incompatible with the hybrid integrated circuitry of some vehicular radios. Attempts are continually being made to replace this type of IF transformer with piezoelectric devices and in particular with ceramic resonator devices.

One impediment to the wider utilization of ceramic resonator devices in such applications has been the lack of a reliable and commercially practical method of fabricating the device. A suitable method should generally have relatively few processing steps; be commercially practical, economically feasible, and provide a reliable device compatible with the integrated circuit technology.

Briefly, a method of fabricating a piezoelectric device includes providing a resilient metallic unit which includes spaced generally parallel leg members interconnected at one end by a bar element, bonding an insulating base across the leg members of the unit, severing the bar element of the unit to provide facing projections; coating the projections with solder; placing a piezoelectric element between the projections allowing it to be compressively suspended there and reflowing the solder to permanently bond the element in place.

Figure 3:
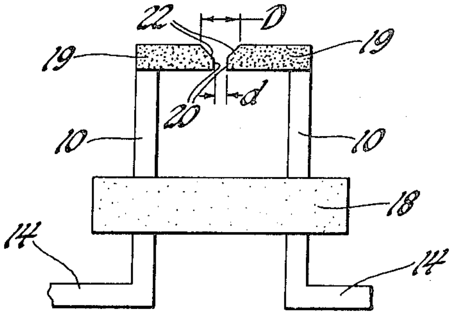
Figure 4:
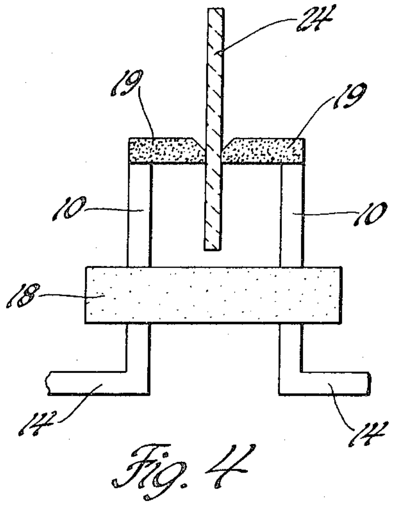
Figure 5:
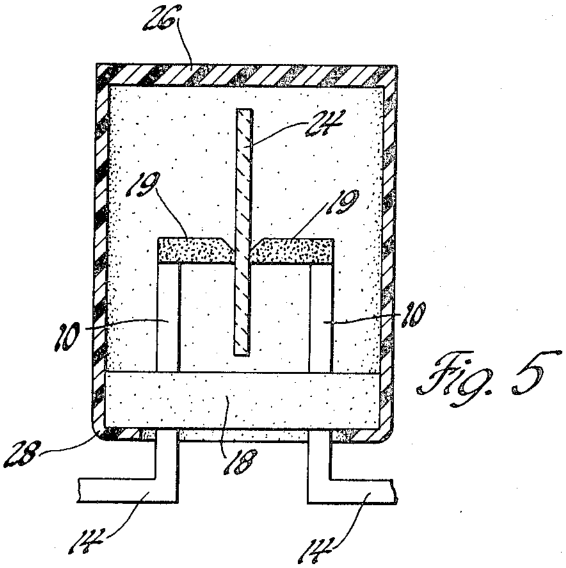

Other objects, features and advantages of this invention will become more apparent from the following description and figures in which:

FIGS. 1–4 depict stages in the fabrication of a device according to this invention; and FIG. 5 depicts, in cross section, a device fabricated according to this invention.

Figure 1:
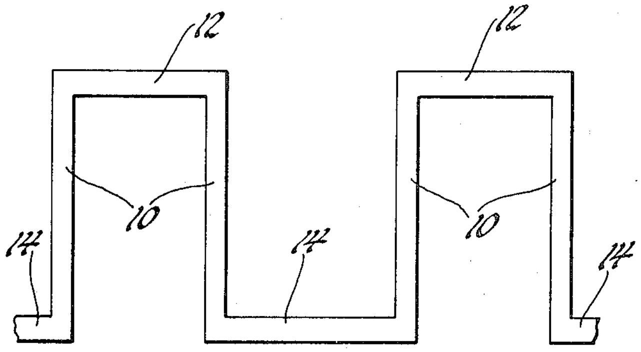

Referring now to the figures and more particularly to FIG. 1, it shows a nickel plated copper connector frame in the form of a flat strip. The strip includes successive inverted generally U-shaped units having spaced parallel leg members, each designated by numeral 10, interconnected at one end by a bar element 12 extending perpendicular thereto. Each unit is connected to a successive unit by a linking segment 14 which is connected between adjacent leg members of adjacent units at the open end thereof. The strip is made of resilient three-quarter hard copper, each part of which being rectangular in cross section with dimensions of 20 × 30 mils.

Figure 2:
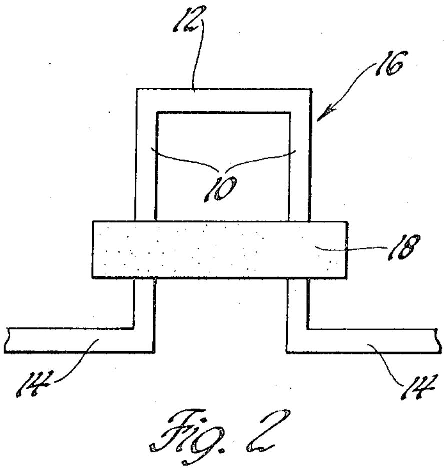

For clarity of presentation, the fabrication of only one piezoelectric device out of the connector frame will be discussed. Accordingly, FIG. 2 shows a unit of the strip, labeled by numeral 16, which includes the parallel leg members interconnected by bar element 12.

A rigid rectangular base member 18 surrounds the middle portion of each of the parallel leg members and extends therebetween. Base member 18 is a thermosetting heat resistant epoxy type of plastic and is placed onto the unit by conventional transfer molding techniques. The base member maintains a predetermined spacing between the parallel leg members during subsequent operations.

Once base member 18 is in place, bar element 12 is sectioned by trimming it therethrough midway between the parallel leg members to form facing projections or leads 19. The projections include ends which face each other. These facing ends each have a contact surface 20, aligned with and extending parallel to each other, adjacent the plastic base member, and a bevelled surface 22 extending outward therefrom. The trimming operation, which can be performed by conventional punching techniques, provides facing projections with a minimum separation between the parallel contact surfaces, designated by the letter d in FIG. 3. The maximum separation therebetween, designated by the letter D in FIG. 3, is three times the minimum spacing.

The projections are then immersed in a molten solder bath of 95 percent lead and 5 percent tin for five seconds and removed. A thin solder coating has been found to give best results and is therefore preferred. Accordingly, excess solder is removed therefrom by rapidly vibrating the unit. The solder is allowed to solidify in the ambient and a thin coating thereof forms over the projections including the end faces.

A ceramic resonator element 24, in the form of a disc, is depicted in FIGS. 4 and 5. Resonator element 24, which is designed to operate in a radial resonant mode, has a diameter of 370 mils, a thickness of 20 mils and a weight of 1 gram. Accordingly, the resonator should be mounted in a manner which allows it to radially expand and contract freely. Each major surface of the disc is coated with a thin, on the order of 1 mil, metallic contact, not shown, containing layers of chrome, gold and copper adhesively secured thereto by conventional bonding techniques. The unit for such a disc has a length of 570 mils and a width of 220 mils, both of which are outside measurements. The plastic base member, which has a rectangular outline of 125 × 280 mils and is 125-mils thick, is located 275 mils from the interconnecting bar member. The minimum spacing, between the contact surface of the projection is 15 mils; while the maximum spacing, between the outermost edge of the bevelled surfaces, is 45 mils.

To continue, after projections 19 have been solder coated, the disc-shaped resonator is inserted between the solder coated projections, forcing them outwardly, from the side adjacent separation D. As the disc is inserted between contact faces 20, they compressively bear thereagainst creating a sufficient frictional force to support the disc and provide a good thermal contact. The disc is positioned such that the contact surfaces, each with dimensions of 20 × 20 mils, bear against a central portion of an opposing major surface of the disc 24. Thus positioned, leads 19 are extending generally perpendicular to the major surfaces of the disc. It should also be pointed out that the bevelled surfaces form a separation therebetween which facilitates disc insertion.

When the disc is centrally positioned between the facing projections the solder thereon can be reflowed. Although any suitable heating means may be used to reflow the solder, radiant heat is preferred. As heat is applied to the projections, solder pools form, via capillary action, at the interface of contact surface 22 and the metallic contacts of the resonator disc. The heat source is removed and the solder pools are allowed to solidify in the ambient thereby forming a permanent bond between the disc and and the projections.

The disc may now be encapsulated by a springlike plastic cap or cover 26, as is shown in FIG. 5. The cap has an inwardly extending circumferential free end 28 and is fastened thereat around an exterior surface of the base member. Other methods can be used to encapsulate the device such as adhesively securing a cover to the base. However, it has been found that such a flexible cap, as herein described, can be simply and economically utilized, and is therefore preferred.

While the aforesaid explanation has focused primarily on the fabrication of only one resonator device to facilitate discussion, a plurality of devices can be fabricated simultaneously by duplicating the aforementioned operations on a plurality of the units. Each device may be detached from the connector frame by severing the linking segments 16 therebetween. Thus, an individual device may be bonded into a circuit board or substrate of a hybrid integrated circuit.

An important aspect of this invention is the fact that the leads contacting the disc are formed from a unitary piece such as the interconnecting bar element. It has been found that perpendicular orientation of the leads with respect to the major surfaces of the disc and lead alignment is easily obtained as a result thereof. Accordingly, the characteristics of the device can be more easily controlled. Moreover, this method reduces the number of solder joints from the four required in a typical resonator device of this type to two which results in a more reliable device.

Further, while the type of copper used herein is described as three-quarter hard, which is preferred, other hardnesses can be used. However, a hardness of less than one-half hard may not provide sufficient compressive support to hold the disc in place prior to reflowing the solder. On the other hand, while whole-hard copper has superior compressive strength, care should be exercised to prevent damage to the disc as it is inserted when using harder materials. Likewise, although copper, nickel plated to inhibit oxidation is preferred, other materials such as aluminum, tin or the like may be used.

Notwithstanding the preferred use of three-quarter hard copper, the projection spacing should still be controlled. A minimum contact surface spacing, *d*, of less then about 60 percent of the disc thickness can cause damage to the disc as it is inserted between the facing projections. On the other hand, a contact spacing of more than about 90 percent of the disc thickness can result in inadequate compressive support for the disc prior to reflowing the solder. Additionally, the maximum spacing, D, between projections should be at least about 1.5 the disc thickness to facilitate insertion therebetween.

Moreover, while the solder composition as used herein was described as 95 percent lead and 5 percent tin, other compositions can be used. However, it has been found that a 95 percent lead and 5 percent tin solder effectively inhibits leaching of the silver in the disc contacts, and is accordingly, preferred. Besides, the preferred solder generally has a higher liquidus temperature than the solder used to make many circuit board and substrate connections. Consequently, the resonator element remains securely attached to the leads during subsequent solder operations thereabout.

While the method herein described provides a commercial practical means of fabricating a piezoelectric device with few processing steps, it is not intended that the invention be limited to such disclosure, but that changes and modifications obvious to those skilled in the art be made and incorporated within the scope of the claims.

I claim:

1. A method of fabricating a piezoelectric device which comprises the steps of providing a resilient metal unit having spaced apart generally parallel leg members interconnected at one end by a bar element, securing a rigid insulating base member between the leg members of the unit, trimming the bar element intermediate the leg members so as to provide facing projections, the ends of which include a contact surface, coating said facing projections with solder, placing a piezoelectric element between the contact surfaces by spreading the facing projections apart so as to compressively support the element therewith, heating said projections in order to reflow the solder to permanently bond the element therebetween, and encapsulating said element by securing a cover to said base member.

2. A method of fabricating a piezoelectric device which comprises the steps of providing a resilient metal unit having spaced apart generally parallel leg members interconnected at one end by a bar element, securing a rigid insulating base member across the middle portion of the leg members of the unit in order to maintain a predetermined spacing therebetween, trimming the bar element intermediate the leg members so as to provide facing projections, the facing ends of which each includes a contact surface generally parallel and aligned with each other, coating said facing projections with solder, placing a ceramic resonator disc, having metal contacts on the opposed major surfaces thereof, between the contact surfaces by spreading the facing projections apart, each of the contact surfaces bearing against a central portion of one of the opposed major surfaces so as to compressively support the disc, heating said projections in order to reflow the solder to permanently bond the element therebetween, and encapsulating said element by securing a cover to said base member.

3. A method of fabricating piezoelectric devices which comprises the steps of providing a resilient striplike connector frame including successive units each having a pair of spaced generally parallel leg members interconnected adjacent one end by a bar element, each unit being connected to an adjacent unit by a linking segment extending therebetween adjacent the opposite end, securing a rigid insulating base member across the middle portion of the leg members of each unit in order to maintain a predetermined spacing between the leg members, trimming the bar element of each unit intermediate the leg members so as to provide facing projections, the facing ends of which each includes a contact surface generally parallel and aligned with each other, coating the facing projections of each unit with solder, placing a piezoelectric element between the contact surfaces of each unit by spreading the facing projections apart so as to compressively support the elements therewith, heating the facing projections of each unit in order to reflow the solder to permanently bond the elements therebetween, severing the linking segment between each unit of the striplike connector frame, and encapsulating the piezoelectric element of each unit by securing a cover to the base member.

4. A method of fabricating ceramic resonator devices each having a ceramic resonator disc of the radial resonator mode with metal contacts over the opposed major surfaces thereof, which method comprises the steps of providing a striplike, at least ½-hard copper connector frame including successive units each having spaced generally parallel leg members interconnected adjacent one end by a bar element extending generally perpendicular thereto, each unit being connected to an adjacent unit by a linking segment extending therebetween adjacent the opposite end, molding a rigid plastic base member around the middle portion of the leg members of each unit to provide predetermined spacing between the leg members, trimming the bar element of each unit midway between the leg members so as to provide facing projections, the facing ends of which each includes a contact surface generally parallel and aligned with each other and an outwardly extending bevelled surface adjacent thereto, the spacing between the contact surfaces being about 60–90 percent of the disc thickness, coating the facing projections of each unit with solder, placing a resonator disc between the contact surfaces of each unit by spreading the facing projections apart, each of the contact surfaces bearing against a central portion of one of the opposed major surfaces of the discs so as to compressively support the discs therebetween, severing the linking segment between each unit of the connector frame, radiantly heating the projections of each unit in order to reflow the solder to permanently bond the discs therebetween, and encapsulating each of the discs by securing a cover to each base member.

5. The method as recited in claim 4 wherein the striplike connector frame is ¾-hard copper and the spacing between the contact surfaces of each unit is about 75 percent the disc thickness.

* * * * *